(12) United States Patent  
Obuchi

(10) Patent No.: US 6,770,165 B2  
(45) Date of Patent: Aug. 3, 2004

(54) APPARATUS FOR PLASMA TREATMENT

(75) Inventor: Kazuto Obuchi, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 186 days.

(21) Appl. No.: 10/200,433

(22) Filed: Jul. 22, 2002

(65) Prior Publication Data

US 2003/0015293 A1 Jan. 23, 2003

(30) Foreign Application Priority Data

Jul. 23, 2001 (JP) .......................................... 2001-221048

(51) Int. Cl.$^7$ ............................ C23C 16/00; C23F 1/00
(52) U.S. Cl. ......................... 156/345.35; 156/345.48; 118/723 R; 118/723 IR; 118/723 ER
(58) Field of Search ................... 118/723 I, 723 IR, 118/723 AN, 723 ER, 723 R; 156/345.35, 345.36, 345.43, 345.47, 345.48, 345.49; 315/111.51

(56) References Cited

U.S. PATENT DOCUMENTS 6,287,643 B1 * 9/2001 Powell et al. ............... 427/562  
2003/0111963 A1 * 6/2003 Tolmachev et al. ..... 315/111.51

* cited by examiner

Primary Examiner—Luz Alejandro-Mulero  
(74) Attorney, Agent, or Firm—Carrier, Blackman & Associates, P.C.; Joseph P. Carrier; William D. Blackman

(57) ABSTRACT

An apparatus for plasma treatment comprises: an outer chamber for plasma generation, which is connected to a gas introduction portion for plasma generation; a coil for plasma generation, which is provided along the periphery of the outer chamber for plasma generation; and a treatment chamber, which is arranged below the outer chamber for plasma generation. In this apparatus for plasma treatment, inside the outer chamber for plasma generation, an inner chamber having a cross-sectional area smaller than that of the outer chamber for plasma generation is provided coaxially with the outer chamber for plasma generation such that the area between the inner periphery of the outer chamber and the outer periphery of the inner chamber is a plasma generation zone.

17 Claims, 3 Drawing Sheets

APPARATUS FOR PLASMA TREATMENT

BACKGROUND OF THE INVENTION

1. Field of the Invention

The present invention relates to an apparatus for plasma treatment which performs the etching, ashing, CVD treatment, ion implementation, etc. of a semiconductor wafer, glass substrate, etc.

2. Description of the Related Art

In a conventional apparatus for plasma treatment, a gas introduction device is provided over a plasma treatment chamber. A gas introduced from this gas introduction device is converted into a plasma by a coil electrode wound around the periphery of the plasma treatment chamber and this gas which has been converted into a plasma reaches a workpiece placed in the lower part of the plasma treatment chamber and is used for the plasma treatment of the object of treatment.

In recent years, the diameter of a workpiece has increased and the diameter of a plasma generation chamber in an apparatus for plasma treatment has also increased accordingly. For this reason, because the velocity of a gas for plasma generation decreases and the uniformity of plasma distribution in the plasma generation chamber worsens, the in-plane uniformity of the plasma for the workpiece also worsens or the plasma may sometimes disappear without reaching the workpiece. As a result, the treatment speed decreases.

SUMMARY OF THE INVENTION

An increase in the volume of an introduced gas is proposed in order to eliminate the above-described disadvantage. However, a larger vacuum pump for evacuation becomes necessary for increasing the volume of an introduced gas, and a more powerful high-frequency power supply becomes necessary for converting the increased gas into a plasma. This eventually leads to the consumption of large amounts of gas and electric power and a decrease in efficiency. At the same time, in actuality the size of the apparatus as a whole increases. Accordingly, it is difficult to put this idea into practical use.

Therefore, the object of the invention is to provide an apparatus for plasma treatment capable of treating a workpiece with good efficiency without the need to increase the size of the apparatus as a whole.

In order to solve the above-described problem, in the invention there is provided an apparatus for plasma treatment which comprises: an outer chamber for plasma generation connected to a gas introduction portion for plasma generation;

a coil for plasma generation provided along the periphery of the outer chamber for plasma generation; and a treatment chamber arranged below the outer chamber for plasma generation. In this plasma treatment apparatus, within the above-described outer chamber for plasma generation, an inner chamber having a cross-sectional area smaller than that of the above-described outer chamber for plasma generation is provided coaxially with the above-described outer chamber for plasma generation.

In the invention, by coaxially installing, for example, an inner chamber inside the outer chamber, the volume between the inside of the outer chamber and the outside of the inner chamber becomes a plasma generation zone. That is, even when the size of the outer chamber for plasma generation increases, the plasma generation zone does not increase, with the result that a generated plasma can reach the workpiece while keeping the uniformity of distribution within the outer chamber even if the volume of the introduced gas is not increased.

DETAILED DESCRIPTION OF THE PREFERRED EMBODIMENT

Figure 1:
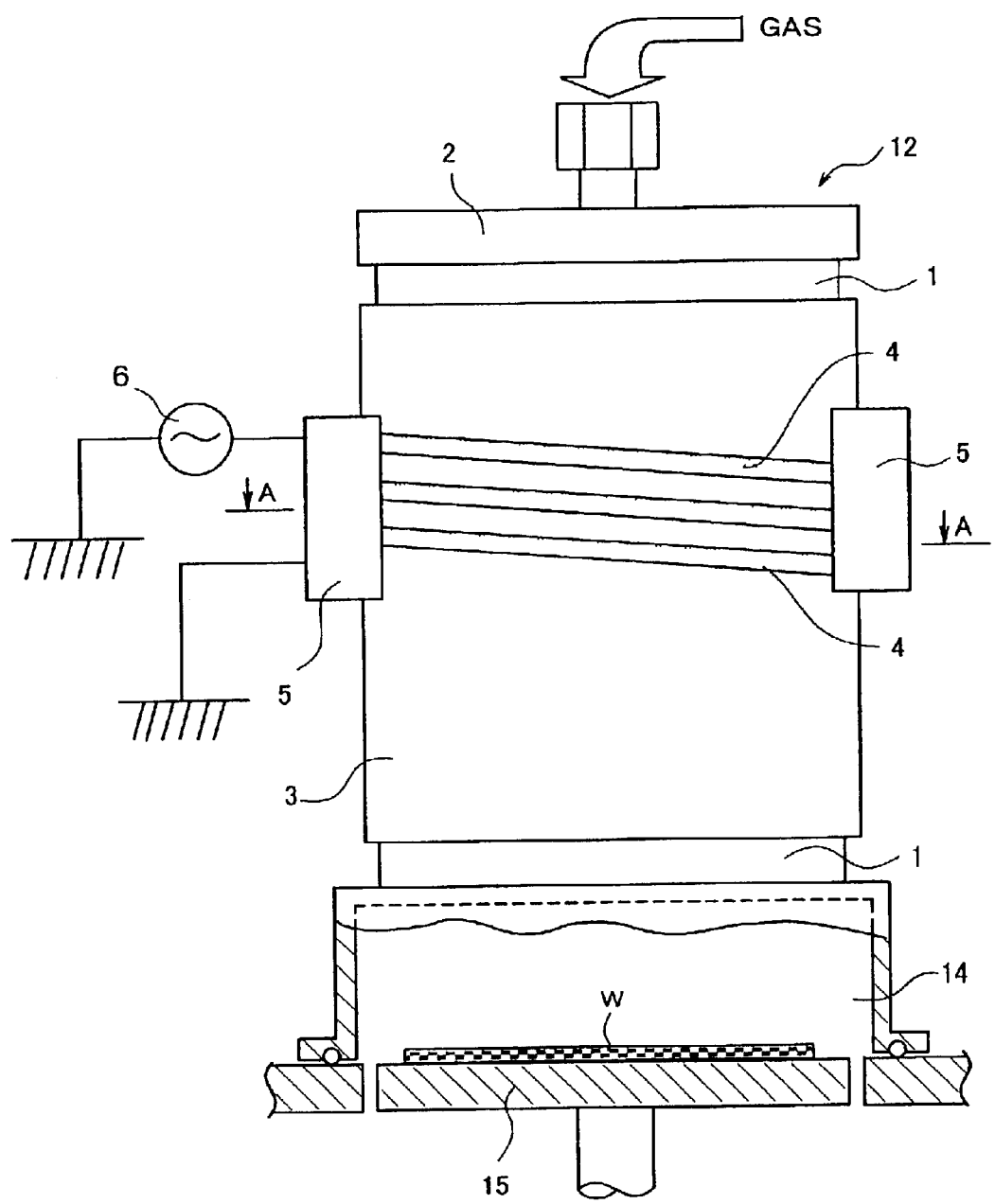
FIG. 1 is a front view of an embodiment of an apparatus for plasma treatment according to the invention.

An embodiment of the invention will be described below. FIG. 1 is a front view of an embodiment of an apparatus for plasma treatment according to the invention.

Figure 2:
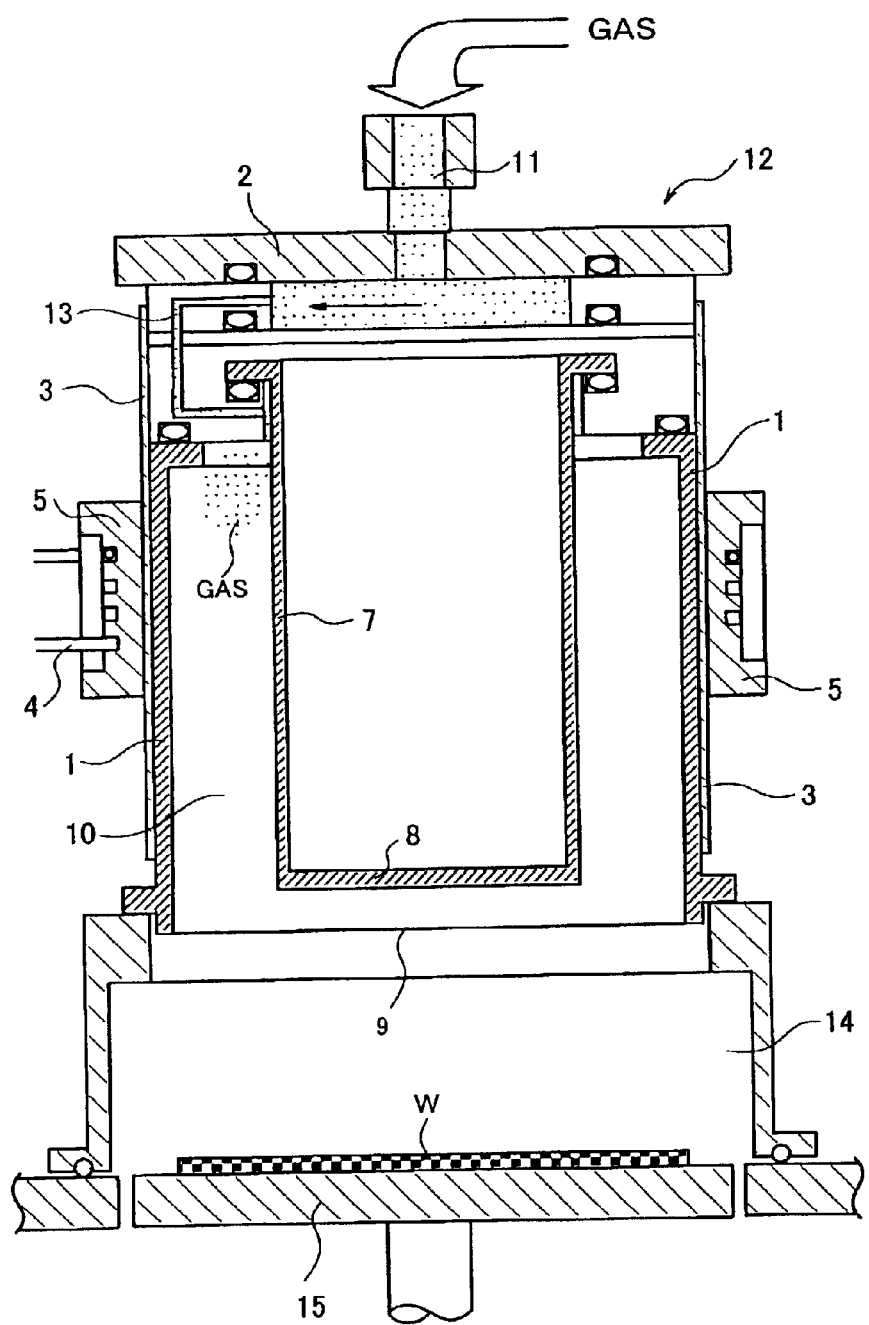
FIG. 2 is a longitudinal sectional view of the apparatus for plasma treatment of FIG. 1.
Figure 3:
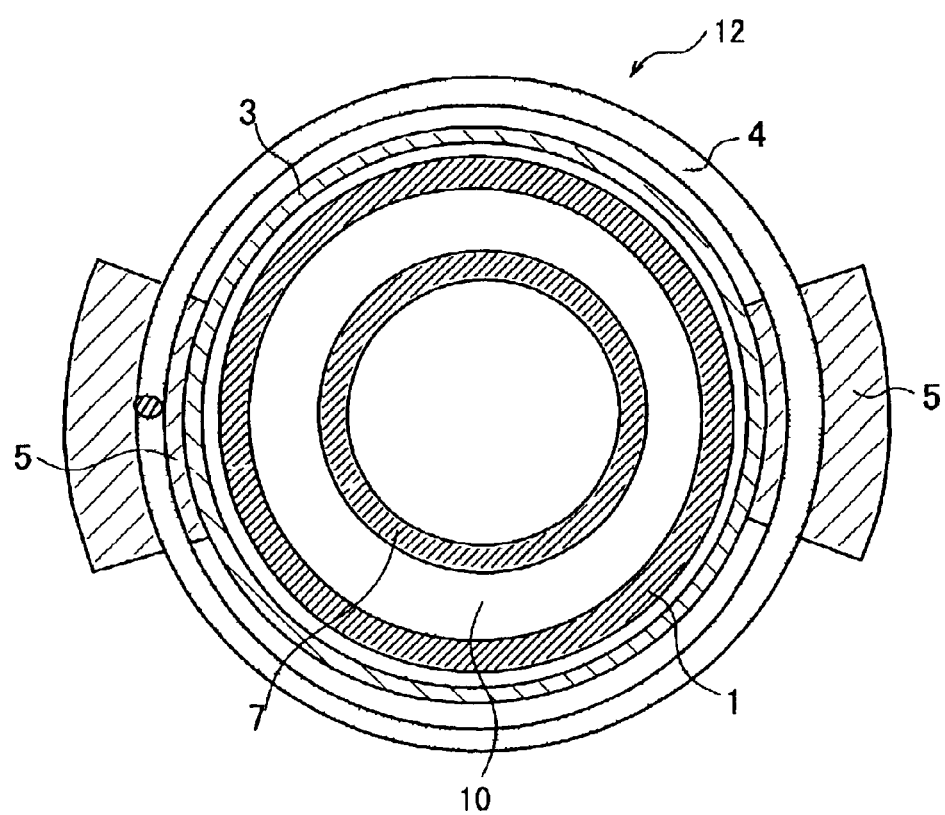
FIG. 3 is a sectional view of the apparatus for plasma treatment of FIG. 1 taken in the direction of the arrows along the line A—A of that figure.

FIG. 2 is a longitudinal sectional view of the apparatus for plasma treatment of FIG. 1. FIG. 3 is a sectional view of the apparatus for plasma treatment of FIG. 1 taken in the direction of the arrows along the line A—A of that figure.

As shown in FIGS. 1 to 3, a top plate 2 is attached to the top of an outer chamber for plasma generation 1. The top plate 2 is provided with a flange for the introduction of a reactive gas. The outer chamber for plasma generation 1 is formed from quartz or ceramics. Moreover, a Faraday shield 3 made of aluminum alloy or stainless steel is formed along the outer periphery of the outer chamber for plasma generation 1.

A coil for plasma generation 4 is provided along the outer periphery of the Faraday shield 3. The coil for plasma generation 4 is attached by two fixing parts 5 and wound around in three convolutions. Moreover, the coil for plasma generation 4 is connected to a high-frequency output unit 6.

Also, as shown in FIG. 2, an inner chamber 7 is coaxially installed inside the outer chamber for plasma generation 1. The diameter of the inner chamber 7 is smaller than that of the outer chamber for plasma generation 1, and the bottom 8 of the inner chamber 7 is positioned at a higher level than the bottom 9 of the outer chamber for plasma generation 1. Then, between the inside of the outer chamber for plasma generation 1 and the outside of the inner chamber 7 is formed a plasma generation zone 10. Incidentally, the material for the inner chamber 7 is the same as that for the outer chamber for plasma generation 1.

Thus, the plasma generation zone 10 is smaller than usual. As a result, even when the size of the outer chamber for plasma generation increases, the plasma generation zone does not widen and the flow velocity of an introduced gas does not decrease because of a narrow sectional area. Therefore, a plasma can be sufficiently generated by means of a conventional pump and power supply.

A gas for plasma generation flows in through a gas introduction portion 11, enters an apparatus for plasma treatment 12, passes through a U-shaped small-diameter tube 13, and is introduced into the plasma generation zone 10. The small-diameter tube 13 corresponds to a gas supply portion. The gas introduction portion 11 and the gas supply portion 13 constitute a gas introduction device.

Incidentally, the inside of the inner chamber 7 is filled with atmospheric air or maintained under vacuum. The type of gas for plasma generation, which is determined in consideration of the material for the workpiece etc., is, for example, helium, argon, nitrogen, air, oxygen, ethylene hexafluoride, propane and butane.

A treatment chamber 14 is provided under the outer chamber for plasma generation 1 and a table 15 for loading and hoisting/lowering a workpiece W, such as a wafer, is provided within the treatment chamber 14.

Thus, a gas introduced from the gas introduction portion 11 over the apparatus for plasma treatment 12 flows through the small-diameter tube 13 and is supplied to the plasma generation zone 10. And the gas, which has been converted into a plasma in the plasma generation zone 10, descends from the plasma generation zone 10. When the gas has passed through the bottom 8 of the inner chamber 7, the gas flows toward the center at a breath and forms vortexes. After that, the gas which has been converted into a plasma reaches, in a uniform condition, the workpiece W on the table 15.

If the distance from the bottom 8 of the inner chamber 7 to the workpiece W is too long, a plasma which has flown in is concentrated in the center portion and it becomes impossible to uniformly treat the whole workpiece W. On the other hand, if there is no distance between the bottom 8 of the inner chamber 7 and the workpiece W, the plasma which has flown in cannot be sufficiently concentrated in the center portion and it becomes impossible to uniformly treat the whole workpiece W.

It is preferred that the distance from the bottom 8 of the inner chamber 7 to the workpiece be 50 to 300 mm.

Incidentally, although the bottom of the inner chamber is closed in this embodiment shown in the figures, the bottom of the inner chamber may not be closed if the volume of the plasma generation zone is reduced. Moreover, although the distance from the bottom of the inner chamber to the workpiece was limited, this range is not limited to the above-described numerical values if this problem is solved. Furthermore, while the electrode for plasma generation shown in the figures is formed in the shape of a coil, the electrode for plasma generation may have the shape of a sheet or the teeth of a comb.

Also, the shape of the Faraday shield is not limited to the example shown in the figures and may be changed as required. For example, the Faraday shield may be provided with slit-like notches or may be formed in strip shape.

According to the invention, by coaxially installing an inner chamber in a hanging manner inside the outer chamber, it is possible to maintain the flow velocity of a gas while reducing the plasma generation area without increasing the volume of the introduced gas. As a result, it is possible to perform uniform plasma treatment of a workpiece of increased diameter without increasing the size of the apparatus as a whole.

Although there has been described in detail what is the present embodiment of the invention, it will be understood by persons skilled in the art that variations and modifications may be made thereto without departing from the gist, spirit or essence of the invention as reflected in the appended claims.

What is claimed is:

1. An apparatus for plasma treatment, comprising: an outer chamber for plasma generation connected to a gas introduction portion for plasma generation;
    an electrode for plasma generation provided along a periphery of said outer chamber for plasma generation; and
    a treatment chamber arranged below said outer chamber for plasma generation,
    wherein in the interior of said outer chamber for plasma generation, an inner chamber having a cross-sectional area smaller than that of said outer chamber for plasma generation is provided coaxially with said outer chamber for plasma generation.

2. The apparatus for plasma treatment according to claim 1, wherein said electrode for plasma generation is a coil.

3. The apparatus for plasma treatment according to claim 2, wherein said coil for plasma generation is provided along the periphery of said outer chamber in multiple convolutions.

4. The apparatus for plasma treatment according to claim 1, wherein the area between the inside of said outer chamber for plasma generation and the outside of said inner chamber for plasma generation is a plasma generation zone.

5. The apparatus for plasma treatment according to claim 1, wherein the interior of said inner chamber is filled with atmospheric air.

6. The apparatus for plasma treatment according to claim 1, wherein the interior of said inner chamber is under vacuum.

7. The apparatus for plasma treatment according to claim 1, wherein the bottom of the inner chamber is open.

8. The apparatus for plasma treatment according to claim 1, wherein said inner chamber is made of quartz or ceramics.

9. The apparatus for plasma treatment according to claim 1, wherein said outer chamber is made of quartz or ceramics.

10. The apparatus for plasma treatment according to claim 1, wherein the distance from the bottom of said inner chamber to a workpiece in said treatment chamber is 50 to 300 mm.

11. An apparatus for plasma treatment, comprising: an outer chamber for plasma generation connected to a gas introduction portion for plasma generation;
    a Faraday shield formed along a periphery of said outer chamber for plasma generation;
    an electrode for plasma generation provided along the outside of said Faraday shield; and
    a treatment chamber arranged below said outer chamber for plasma generation,
    wherein in the interior of said outer chamber for plasma generation, an inner chamber having a cross-sectional area smaller than that of said outer chamber for plasma generation is provided coaxially with said outer chamber for plasma generation.

12. The apparatus for plasma treatment according to claim 11, wherein said electrode for plasma generation is attached by fixing parts disposed along the outside periphery of said Faraday shield.

13. The apparatus for plasma treatment according to claim 11, wherein said Faraday shield has slit-like notches.

14. The apparatus for plasma treatment according to claim 11, wherein said Faraday shield is formed in strip shape.

15. The apparatus for plasma treatment according to claim 11, wherein said Faraday shield is made of aluminum alloy.

16. The apparatus for plasma treatment according to claim 11, wherein said Faraday shield is made of stainless steel.

17. The apparatus for plasma treatment according to claim 11, wherein the area between the inside of said outer chamber for plasma generation and the outside of said inner chamber for plasma generation is a plasma generation zone.

* * * * *